(12) United States Patent
Sun et al.

(10) Patent No.: US 12,295,231 B2
(45) Date of Patent: May 6, 2025

(54) DISPLAY PANEL, METHOD FOR MANUFACTURING SAME, AND DISPLAY TERMINAL

(71) Applicant: WUHAN CHINA STAR OPTOELECTRONICS SEMICONDUCTOR DISPLAY TECHNOLOGY CO., LTD., Hubei (CN)

(72) Inventors: Liang Sun, Hubei (CN); Chaoqun Yang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/622,859

(22) PCT Filed: Dec. 17, 2021

(86) PCT No.: PCT/CN2021/139178
§ 371 (c)(1),
(2) Date: Dec. 26, 2021

(87) PCT Pub. No.: WO2023/103040
PCT Pub. Date: Jun. 15, 2023

(65) Prior Publication Data
US 2024/0040884 A1    Feb. 1, 2024

(30) Foreign Application Priority Data

Dec. 10, 2021    (CN) .......................... 202111509560.6

(51) Int. Cl.
*H10K 59/38*  (2023.01)
*H10K 59/80*  (2023.01)
*H10K 71/13*  (2023.01)

(52) U.S. Cl.
CPC .......... *H10K 59/38* (2023.02); *H10K 59/873* (2023.02); *H10K 59/8792* (2023.02); *H10K 71/135* (2023.02)

(58) Field of Classification Search
None
See application file for complete search history.

(56) References Cited

U.S. PATENT DOCUMENTS

2016/0293676 A1*  10/2016  Komatsu .............. H10K 59/351
2018/0301514 A1*  10/2018  Li ........................ H10K 50/125
(Continued)

FOREIGN PATENT DOCUMENTS

CN    110729336 A    1/2020
CN    110854167 A    2/2020
(Continued)

OTHER PUBLICATIONS

International Search Report in International application No. PCT/CN2021/139178, mailed on Sep. 6, 2022.
(Continued)

*Primary Examiner* — Jay C Chang
(74) *Attorney, Agent, or Firm* — PV IP PC; Wei Te Chung

(57) ABSTRACT

A display panel, a method for manufacturing the same, and a display terminal are provided. The display panel includes an array substrate, a light-emitting device layer, and a color resist layer. The light-emitting device layer is disposed on the array substrate and includes a red light-emitting device, a first blue light-emitting device, and a second blue light-emitting device. The color resist layer is disposed on the
(Continued)

light-emitting device layer and includes a red color resist, a blue color resist, and a green color conversion unit. The red color resist is disposed corresponding to the red light-emitting device. The blue color resist is disposed corresponding to the first blue light-emitting device. The green color conversion unit is disposed corresponding to the second blue light-emitting device and is configured to convert a light emitted by the second blue light-emitting device into a green light.

17 Claims, 3 Drawing Sheets

(56) References Cited

U.S. PATENT DOCUMENTS

| | | | | |
|---|---|---|---|---|
| 2021/0305322 | A1* | 9/2021 | Song | H10K 59/124 |
| 2023/0030824 | A1* | 2/2023 | Lim | H01L 27/14667 |

FOREIGN PATENT DOCUMENTS

| | | |
|---|---|---|
| CN | 111162200 A | 5/2020 |
| CN | 111180495 A | 5/2020 |
| CN | 111490087 A | 8/2020 |
| CN | 111710770 A | 9/2020 |
| CN | 111710774 A | 9/2020 |
| CN | 111900193 A | 11/2020 |
| CN | 112310177 A | 2/2021 |
| CN | 113113455 A | 7/2021 |
| KR | 20090007864 A | 1/2009 |

OTHER PUBLICATIONS

Written Opinion of the International Search Authority in International application No. PCT/CN2021/139178, mailed on Sep. 6, 2022.

Chinese Office Action issued in corresponding Chinese Patent Application No. 202111509560.6 dated Nov. 21, 2022, pp. 1-7.

* cited by examiner

DISPLAY PANEL, METHOD FOR MANUFACTURING SAME, AND DISPLAY TERMINAL

FIELD OF INVENTION

The present disclosure relates to the technical field of display, and particularly to a display panel, a method for manufacturing the same, and a display terminal.

BACKGROUND

An organic light-emitting display (OLED) panel does not require a backlight. The organic light-emitting display panel comprises a light-emitting device layer. The light-emitting device layer comprises light-emitting materials. When there is a current passing through, these light-emitting materials will emit light, thus realizing display. Compared with a liquid crystal display (LCD) panel, the organic light-emitting display panel can be made lighter and thinner, have a wider viewing angle, and significantly save power consumption. In recent years, with maturity of OLED technology, a penetration rate of OLEDs in the market has been increasing year by year.

However, color gamuts of OLEDs are limited by characteristics of fluorescent and phosphorescent light-emitting materials, and generally only reach about 110% of national television system committee (NTSC).

As consumers' demand for rich-color and colorful displays has increased year by year, development of wide-color gamut displays has gradually become a research hotspot in recent years. Therefore, current organic light-emitting display panels have a problem of insufficient color gamut.

SUMMARY OF DISCLOSURE

The present disclosure provides a display panel, a method for manufacturing the same, and a display terminal to solve a technical problem of insufficient color gamuts of current organic light-emitting display panels.

The present disclosure provides a display panel comprising:
- an array substrate;
- a light-emitting device layer disposed on the array substrate and comprising a red light-emitting device, a first blue light-emitting device, and a second blue light-emitting device; and
- a color resist layer disposed on the light-emitting device layer and comprising a red color resist, a blue color resist, and a green color conversion unit, wherein the red color resist is disposed corresponding to the red light-emitting device, the blue color resist is disposed corresponding to the first blue light-emitting device, and the green color conversion unit is disposed corresponding to the second blue light-emitting device and is configured to convert a light emitted by the second blue light-emitting device into a green light.

In some embodiments, the green color conversion unit is made of perovskite.

In some embodiments, the red light-emitting device is disposed between the first blue light-emitting device and the second blue light-emitting device.

In some embodiments, the color resist layer further comprises a spacer layer. The spacer layer comprises a plurality of openings. The red color resist, the blue color resist, and the green color conversion unit are disposed in the openings of the spacer layer.

In some embodiments, the spacer layer is a black matrix.

In some embodiments, the display panel further comprises a first encapsulation layer disposed on a side of the color resist layer away from the light-emitting device layer.

In some embodiments, the display panel further comprises a second encapsulation layer disposed between the light-emitting device layer and the color resist layer.

The present disclosure further provides a method for manufacturing a display panel. The method comprises:
- step S100: providing an array substrate;
- step S200: forming a light-emitting device layer on the array substrate, which comprises forming a red light-emitting device, a first blue light-emitting device, and a second blue light-emitting device; and
- step S300: forming a color resist layer on the light-emitting device layer, which comprises forming a red color resist, a blue color resist, and a green color conversion unit, wherein the red color resist is formed corresponding to the red light-emitting device, the blue color resist is formed corresponding to the first blue light-emitting device, and the green color conversion unit is formed corresponding to the second blue light-emitting device.

In some embodiments, in the step S200, the green color conversion unit is made of perovskite.

In some embodiments, in the step S300, the green color conversion unit is formed by vapor deposition of perovskite or inkjet printing perovskite.

The present disclosure further provides a display terminal comprising a terminal body and a display panel. The terminal body and the display panel are combined into one body. The display panel comprises:
- an array substrate;
- a light-emitting device layer disposed on the array substrate and comprising a red light-emitting device, a first blue light-emitting device, and a second blue light-emitting device; and
- a color resist layer disposed on the light-emitting device layer and comprising a red color resist, a blue color resist, and a green color conversion unit, wherein the red color resist is disposed corresponding to the red light-emitting device, the blue color resist is disposed corresponding to the first blue light-emitting device, and the green color conversion unit is disposed corresponding to the second blue light-emitting device and is configured to convert a light emitted by the second blue light-emitting device into a green light.

In some embodiments, the green color conversion unit is made of perovskite.

In some embodiments, the red light-emitting device is disposed between the first blue light-emitting device and the second blue light-emitting device.

In some embodiments, the color resist layer further comprises a spacer layer. The spacer layer comprises a plurality of openings. The red color resist, the blue color resist, and the green color conversion unit are disposed in the openings of the spacer layer.

In some embodiments, the spacer layer is a black matrix.

In some embodiments, the display terminal further comprises a first encapsulation layer disposed on a side of the color resist layer away from the light-emitting device layer.

In some embodiments, the display terminal further comprises a second encapsulation layer disposed between the light-emitting device layer and the color resist layer.

The present disclosure provides a display panel, a method for manufacturing the same, and a display terminal. The display panel comprises an array substrate, a light-emitting device layer, and a color resist layer. The light-emitting device layer is disposed on the array substrate and comprises a red light-emitting device, a first blue light-emitting device, and a second blue light-emitting device. The color resist layer is disposed on the light-emitting device layer and comprises a red color resist, a blue color resist, and a green color conversion unit. The red color resist is disposed corresponding to the red light-emitting device. The blue color resist is disposed corresponding to the first blue light-emitting device. The green color conversion unit is disposed corresponding to the second blue light-emitting device and is configured to convert a light emitted by the second blue light-emitting device into a green light. The green light generated by the green color conversion unit reduces an amount of blue light, which reduces a half-peak width of the green light, and improves a color gamut of the display panel, thereby realizing an organic light-emitting display panel with an ultra-high color gamut.

BRIEF DESCRIPTION OF DRAWINGS

In order to more clearly illustrate technical solutions in embodiments of the present disclosure, a brief description of accompanying drawings used in a description of the embodiments of the present disclosure will be given below. Obviously, the accompanying drawings in the following description are merely some embodiments of the present disclosure. For those skilled in the art, other drawings may be obtained from these accompanying drawings without creative labor.

DETAILED DESCRIPTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure. In addition, it should be understood that specific embodiments described herein are only used to illustrate and explain the present invention, and are not used to limit the present invention. In the present disclosure, unless otherwise stated, directional terms used herein specifically indicate directions of the accompanying drawings. For example, directional terms "upper" and "lower" generally refer to upper and lower positions of a device in actual use or working conditions, and directional terms "inside" and "outside" refer to positions relative to a profile of the device.

The present disclosure provides a display panel. The display panel comprises an array substrate, a light-emitting device layer, and a color resist layer. The light-emitting device layer is disposed on the array substrate and comprises a red light-emitting device, a first blue light-emitting device, and a second blue light-emitting device. The color resist layer is disposed on the light-emitting device layer and comprises a red color resist, a blue color resist, and a green color conversion unit. The red color resist is disposed corresponding to the red light-emitting device. The blue color resist is disposed corresponding to the first blue light-emitting device. The green color conversion unit is disposed corresponding to the second blue light-emitting device and is configured to convert a light emitted by the second blue light-emitting device into a green light.

The present disclosure provides a display panel, a method for manufacturing the same, and a display terminal, which will be described in detail below. It should be noted that a description order of the following embodiments is not intended to limit a preferred order of the embodiments.

First Embodiment

Figure 1:
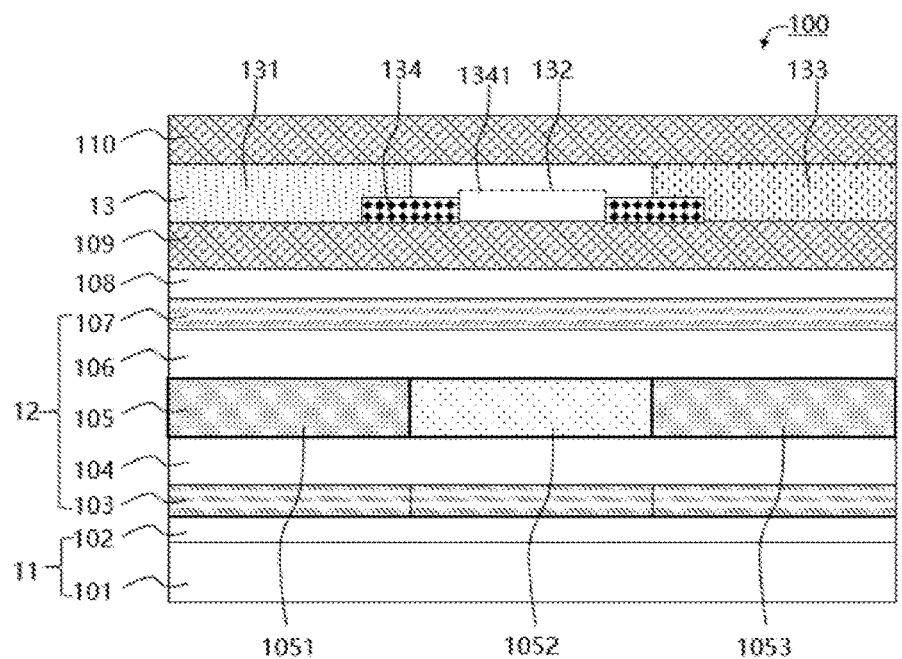
FIG. 1 is a schematic diagram of a first structure of a display panel according to an embodiment of the present disclosure.

Please refer to FIG. 1, which is a schematic diagram of a first structure of a display panel 100 according to an embodiment of the present disclosure.

The present disclosure provides a display panel 100. The display panel 100 comprises an array substrate 11, a light-emitting device layer 12, and a color resist layer 13. The light-emitting device layer 12 is disposed on the array substrate 11 and comprises a red light-emitting device 1052, a first blue light-emitting device 1051, and a second blue light-emitting device 1053. The color resist layer 13 is disposed on the light-emitting device layer 12 and comprises a red color resist 132, a blue color resist 131, and a green color conversion unit 133. The red color resist 132 is disposed corresponding to the red light-emitting device 1052. The blue color resist 131 is disposed corresponding to the first blue light-emitting device 1051. The green color conversion unit 133 is disposed corresponding to the second blue light-emitting device 1053 and is configured to convert a light emitted by the second blue light-emitting device 1053 into a green light.

Specifically, the array substrate 11 comprises a base substrate 101 and an array functional layer 102. The base substrate 101 may be made of glass, plastic, or the like. The array functional layer 102 may comprise a plurality of thin film transistors (TFTs) arranged in an array.

Specifically, the light-emitting device layer 12 comprises the red light-emitting device 1052, the first blue light-emitting device 1051, and the second blue light-emitting device 1053. The light-emitting device layer 12 may further comprise a first electrode layer 103, a first common material layer 104, a light-emitting material layer 105, a second common material layer 106, and a second electrode layer 107.

Specifically, the first electrode layer 103 may be an anode electrode, and the second electrode layer 107 may be a cathode electrode, but are not limited thereto. Alternatively, the first electrode layer 103 may be a cathode electrode, and the second electrode layer 107 may be an anode electrode.

Specifically, in the following embodiments, the first electrode layer 103 is used as the anode electrode, and the second electrode layer 107 is used as the cathode electrode to illustrate the embodiments of the present disclosure.

Specifically, it is easily understood by those skilled in the art that the first electrode layer 103 may comprise a plurality of anode electrodes. The anode electrodes respectively correspond to or belong to the red light-emitting device 1052, the first blue light-emitting device 1051, and the second blue light-emitting device 1053, which will not be described in detail herein.

Specifically, it is easily understood by those skilled in the art that the first common material layer 104 may comprise a hole injection layer, a hole transport layer, and the like. The first common material layer 104 may correspond to or belong to the red light-emitting device 1052, the first blue light-emitting device 1051, and the second blue light-emitting device 1053, which will not be described in detail herein.

Specifically, it is easily understood by those skilled in the art that the light-emitting material layer 105 may comprise a plurality of independent light-emitting material sub-layers. The light-emitting material sub-layers respectively correspond to or belong to the red light-emitting device 1052, the first blue light-emitting device 1051, and the second blue light-emitting device 1053. A light-emitting material of the red light-emitting device 1052 is different from a light-emitting material of the first blue light-emitting device 1051 and the second blue light-emitting device 1053, so that the red light-emitting device 1052 emits red light, the first blue light-emitting device 1051 emits blue light, and the second blue light-emitting device 1053 emits blue light, which will not be described in detail herein.

Specifically, those skilled in the art can easily understand that the second common material layer 106 may comprise an electron injection layer, an electron transport layer, and the like. The second common material layer 106 may correspond to or belong to the red light-emitting device 1052, the first blue light-emitting device 1051, and the second blue light-emitting device 1053, which will not be described in detail herein.

Specifically, it is easily understood by those skilled in the art that the second electrode layer 107 may be an entire surface of cathode electrode, which corresponds to or belongs to the red light-emitting device 1052, the first blue light-emitting device 1051, and the second blue light-emitting device 1053, which will not be described in detail herein.

Specifically, a laminated structure of the display panel 100 comprises the array substrate 11, the light-emitting device layer, and the color resist layer 13 in sequence. The laminated structure of the display panel 100 may further comprise other layers, which will be described in the following embodiments.

Specifically, the red color resist 132 is disposed corresponding to the red light-emitting device 1052. The red color resist 132 may partially absorb a light emitted by the red light-emitting device 1052 to narrow a half-peak width of a red light emitted by the display panel 100, thereby increasing a color gamut (color saturation) of the display panel 100 or adjusting a red color coordinate.

Specifically, the blue color resist 131 is disposed corresponding to the first blue light-emitting device 1051. The blue color resist 131 may partially absorb a light emitted by the first blue light-emitting device 1051 to narrow a half-peak width of a blue light emitted by the display panel 100, thereby increasing the color gamut (color saturation) of the display panel 100 or adjusting a blue color coordinate.

Specifically, the green color conversion unit 133 is disposed corresponding to the second blue light-emitting device 1053. The green color conversion unit 133 is configured to convert the light emitted by the second blue light-emitting device 1053 into the green light. The green light converted or excited by the green color conversion unit 133 has a narrow spectrum and a low amount of blue light, which can improve the color gamut (color saturation) of the display panel 100.

In some embodiments, the green color conversion unit 133 is made of perovskite.

Specifically, perovskite is a good material for the green color conversion unit 133. The green light generated by the green color conversion unit 133 made of perovskite has a narrow spectrum and a low amount of blue light, which greatly increases the color gamut (color saturation) of the display panel 100.

In some embodiments, the red light-emitting device 1052 is disposed between the first blue light-emitting device 1051 and the second blue light-emitting device 1052.

Specifically, the red light-emitting device 1052 is disposed between the first blue light-emitting device 1051 and the second blue light-emitting device 1052, so that the first blue light-emitting device 1051 has a larger distance or a largest possible distance from the second blue light-emitting device 1053. This prevents the light emitted by the first blue light-emitting device 1051 from entering the green color conversion unit 133, and prevents the light emitted by the second blue light-emitting device 1053 from entering the blue color resist 131, thereby avoiding color mixing and crosstalk.

Specifically, a thickness of the red color resist is 1 μm to 4 μm, a thickness of the blue color resist is 1 μm to 4 μm, and a thickness of the green color conversion unit 133 is 1 μm to 3 μm.

In this embodiment, the green color conversion unit 133 is disposed corresponding to the second blue light-emitting device 1053, and the green color conversion unit 133 is configured to convert the light emitted by the second blue light-emitting device 1053 into the green light. The green light generated by the green color conversion unit 133 reduces an amount of blue light, which reduces a half-peak width of the green light, and improves a color gamut of the display panel 100, thereby realizing an organic light-emitting display panel with an ultra-high color gamut. The color gamut of the display panel 100 of this embodiment can reach BT2020 color gamut.

Second Embodiment

This embodiment is same as or similar to the above embodiment, with a difference that a structure of the display panel 100 is further described.

In some embodiments, the color resist layer 13 further comprises a spacer layer 134. The spacer layer 134 comprises a plurality of openings 1341. The red color resist 132, the blue color resist 131, and the green color conversion unit 133 are disposed in the spacer layer 134.

Specifically, as shown in FIG. 1, the spacer layer 134 comprises the openings 1341. The red color resist 132, the blue color resist 131, and the green color conversion unit 133 are disposed in the openings 1341 of the spacer layer 134.

Specifically, the openings 1341 of the spacer layer 134 are configured to accommodate the red color resist 132, the blue color resist 131, and the green color conversion unit 13. The spacer layer 134 separates the red color resist 132, the blue color resist 131, and the green color conversion unit 13 to prevent color mixing.

In some embodiments, the spacer layer 134 is a black matrix.

Specifically, the spacer layer 134 is the black matrix, namely BM.

Specifically, the black matrix as the spacer layer 134 not only separates the red color resist 132, the blue color resist 131, and the green color conversion unit 133, but also absorbs ambient light, reduces a reflection of the ambient light by the display panel 100, and improves an image display quality.

In this embodiment, the black matrix as the spacer layer 134, the red color resist 132, and the blue color resist 131 can absorb most of the ambient light. Therefore, the display panel 100 does not need to be provided with an anti-reflection polarizer, thereby reducing layers and a thickness of the display panel 100, which is beneficial to cost reduction.

Third Embodiment

This embodiment is same as or similar to the above embodiments, with a difference that the structure of the display panel 100 is further described.

In some embodiments, the display panel 100 further comprises a first encapsulation layer 110. The first encapsulation layer 110 is disposed on a side of the color resist layer 13 away from the light-emitting device layer 12.

Specifically, the first encapsulation layer 110 is disposed on a surface of the color resist layer 13 to protect the color resist layer 13 and prevent water and oxygen from entering the light-emitting device layer 12 of the display panel 100, thereby preventing a service life of the display panel 100 from being reduced.

Specifically, the first encapsulation layer 110 may be an inorganic material layer, an organic material layer, or a multilayer laminated structure of inorganic material layers and organic material layers.

In some embodiments, the display panel 100 further comprises a second encapsulation layer 109. The second encapsulation layer 109 is disposed between the light-emitting device layer 12 and the color resist layer 13.

Specifically, the second encapsulation layer 109 is disposed on a surface of light-emitting device layer 12 to protect the light-emitting device layer 12 and prevent water and oxygen from entering the light-emitting device layer 12 of the display panel 100, thereby preventing the service life of the display panel 100 from being reduced.

Specifically, the second encapsulation layer 109 may be an inorganic material layer, an organic material layer, or a multilayer laminated structure of inorganic material layers and organic material layers.

It should be noted that in some embodiments, the display panel 100 further comprises a light extraction layer 108. The light extraction layer 108 is disposed on a surface of the second electrode layer 107. For example, the light extraction layer 108 is disposed between the second electrode layer 107 and the second encapsulation layer 109. The light extraction layer 108 may be a circular polarizer layer (CPL), but is not limited thereto.

Fourth Embodiment

This embodiment is same as or similar to the above embodiments, with a difference that the structure of the display panel 100 is further described.

Figure 2:
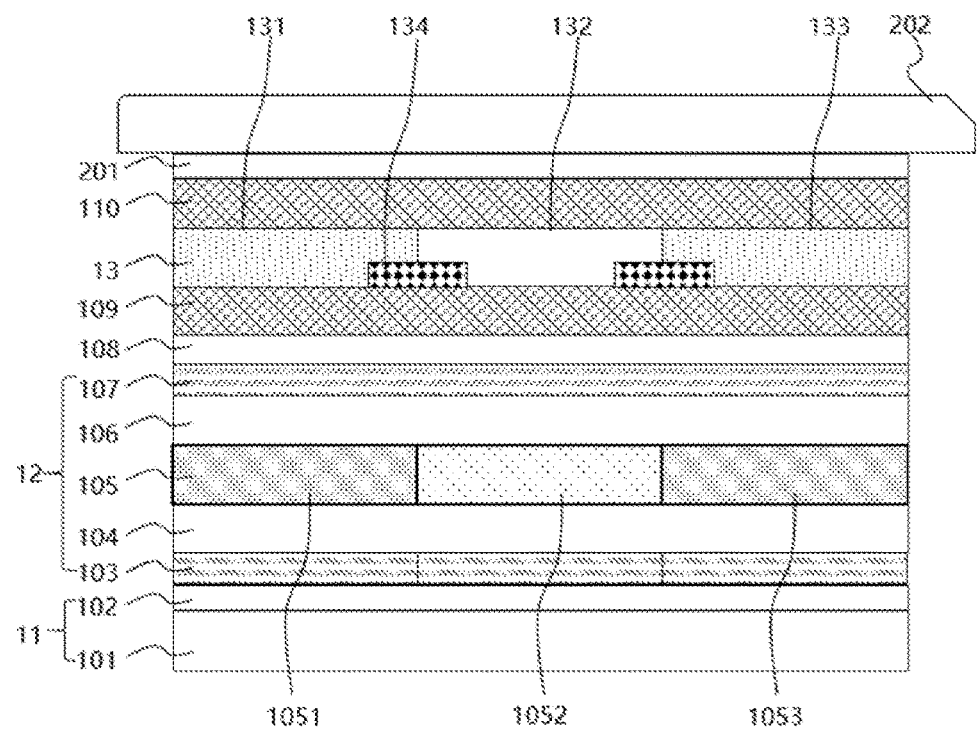
FIG. 2 is a schematic diagram of a second structure of a display panel according to an embodiment of the present disclosure.
Figure 3:
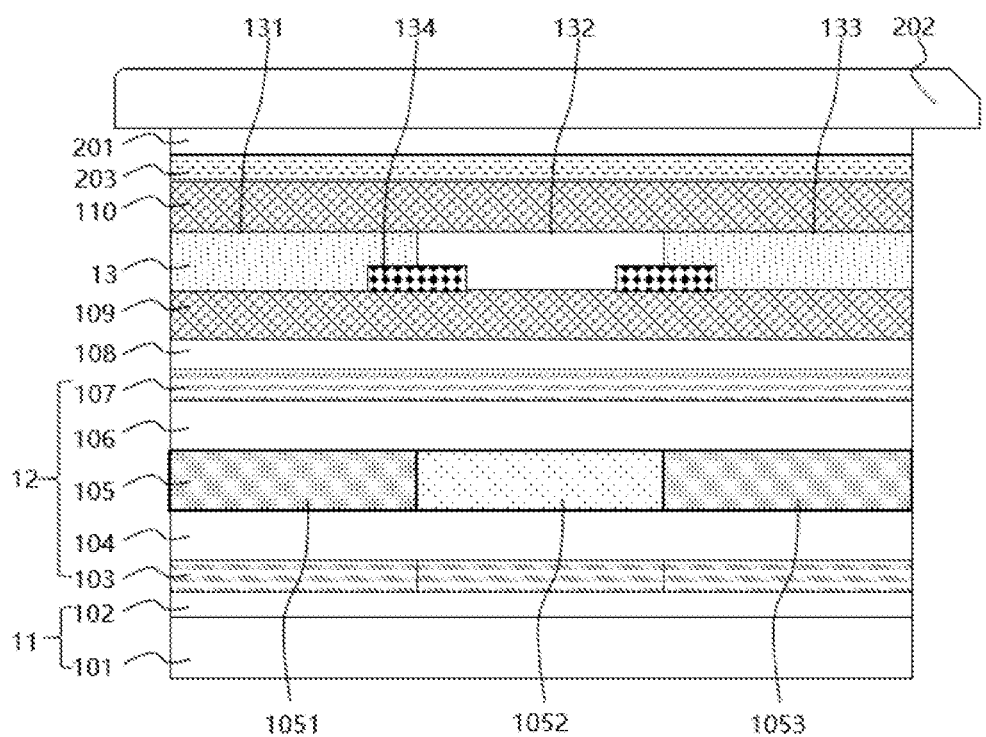
FIG. 3 is a schematic diagram of a third structure of a display panel according to an embodiment of the present disclosure.

Please refer to FIG. 2 and FIG. 3. FIG. 2 is a schematic diagram of a second structure of a display panel 100 according to an embodiment of the present disclosure. FIG. 3 is a schematic diagram of a third structure of a display panel 100 according to an embodiment of the present disclosure.

In some embodiments, the display panel 100 further comprises a protective cover 202, and the protective cover 202 is connected to the first encapsulation layer 110 through an adhesive layer 201.

Specifically, the protective cover 202, namely cover glass, CG for short, is also called a window.

Specifically, as shown in FIG. 2, no touch layer is disposed on a surface of the first encapsulation layer 110 of the display panel 100. The display panel 100 is not provided with a polarizer. The protective cover 202 is connected to the first encapsulation layer 110 through the adhesive layer 201.

In some embodiments, the display panel 100 further comprises a touch layer 203 and a protective cover 202. The touch layer 203 is disposed on a side of the first encapsulation layer 110 away from the light-emitting device layer 12. The protective cover 202 is connected to the touch layer 203 through an adhesive layer 201.

Specifically, as shown in FIG. 3, the touch layer 203 is disposed on a surface of the first encapsulation layer 110 of the display panel 100. The display panel 100 is not provided with a polarizer. The protective cover 202 is connected to the touch layer 203 through the adhesive layer 201.

Fifth Embodiment

This embodiment provides a method for manufacturing a display panel. Any display panel 100 in the above embodiments can be manufactured by the method for manufacturing the display panel of this embodiment.

Figure 4:
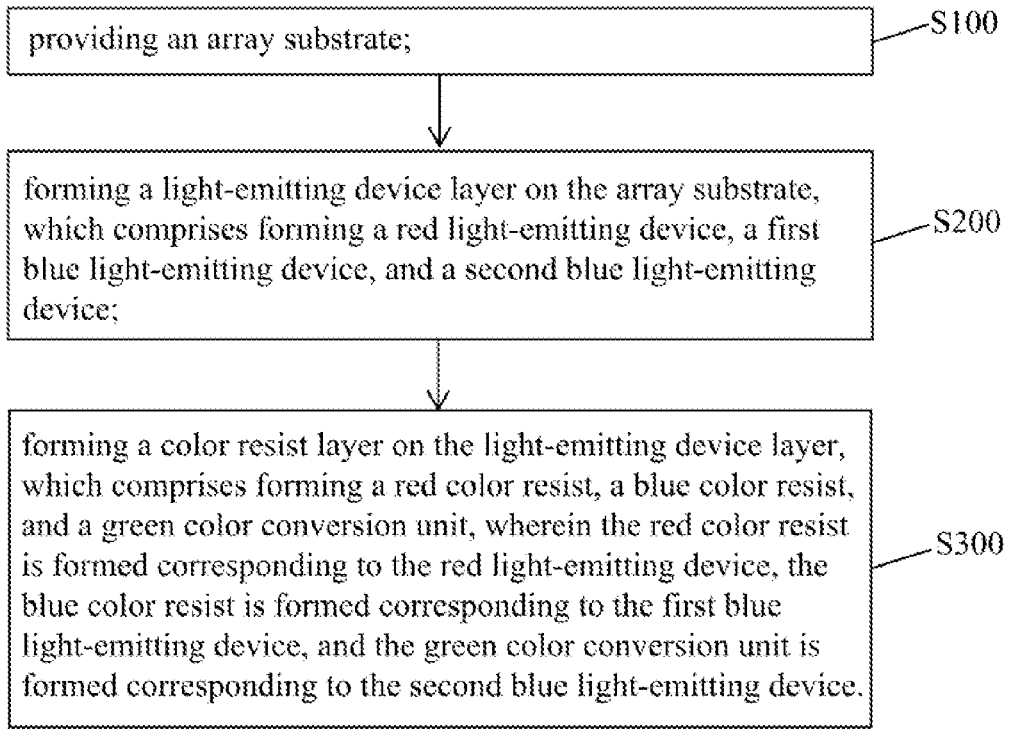
FIG. 4 is a schematic flowchart of a method for manufacturing a display panel according to an embodiment of the present disclosure.

Please refer to FIG. 4, which is a schematic flowchart of a method for manufacturing a display panel according to an embodiment of the present disclosure.

This embodiment provides the method for manufacturing the display panel. The method comprises step S100, step S200, and step S300.

Step S100: providing an array substrate.

Specifically, the array substrate 11 has been manufactured or purchased.

Step S200: forming a light-emitting device layer on the array substrate, which comprises forming a red light-emitting device, a first blue light-emitting device, and a second blue light-emitting device.

Specifically, the light-emitting device layer 12 is formed on the array substrate 11. Forming the light-emitting device layer 12 comprises forming the red light-emitting device 1052, the first blue light-emitting device 1051, and the second blue light-emitting device 1053. A structure of the light-emitting device layer 12 has been described in the above embodiments, and will not be described in detail herein.

step S300: forming a color resist layer on the light-emitting device layer, which comprises forming a red color resist, a blue color resist, and a green color conversion unit, wherein the red color resist is formed corresponding to the red light-emitting device, the blue color resist is formed corresponding to the first blue light-emitting device, and the green color conversion unit is formed corresponding to the second blue light-emitting device.

Specifically, the color resist layer 13 is formed on the light-emitting device layer 12. Forming the color resist layer 13 comprises forming the red color resist 132, the blue color resist 131, and the green color conversion unit 133. The red color resist 132 is formed corresponding to the red light-emitting device 1052. The blue color resist 131 is formed corresponding to the first blue light-emitting device 1051. The green color conversion unit 133 is formed corresponding to the second blue light-emitting device 1053. A structure of the color resist layer 13 has been described in the above embodiments, and will not be described in detail herein.

Specifically, the black matrix (BM) is formed on the light-emitting device layer 12 by a low-temperature manufacturing process, and then the red color resist 132 and the blue color resist 131 are formed. This ensures that a preset position where the green color conversion unit 133 is to be formed later is left blank. Then, the array substrate 11 is placed in a vapor deposition chamber of a vapor deposition device, and the green color conversion unit 133 is formed at the preset position. Then, the first encapsulation layer 110 is formed.

Specifically, the second encapsulation layer 109 may be further formed on the light-emitting device layer 12. Then, the black matrix (BM) is formed on the second encapsulation layer 109 by a low-temperature manufacturing process, and then the red color resist 132 and the blue color resist 131 are formed. This ensures that a preset position where the green color conversion unit 133 is to be formed later is left blank. Then, the array substrate 11 is placed in the vapor deposition chamber of the vapor deposition device, and the green color conversion unit 133 is formed at the preset position. Then, the first encapsulation layer 110 is formed.

In some embodiments, in the step S200, the green color conversion unit is made of perovskite.

Specifically, in the step S200, the green color conversion unit 133 is made of perovskite. A structure and material of the green color conversion unit 133 has been described in the above embodiments, and will not be described in detail herein.

In some embodiments, in the step S300, the green color conversion unit is formed by vapor deposition of perovskite or inkjet printing perovskite.

Specifically, in the step S300, the green color conversion unit 133 is formed by vapor deposition of perovskite or inkjet printing perovskite.

Specifically, by vapor deposition of perovskite or inkjet printing perovskite, perovskite can be placed only on a portion corresponding to the green color conversion unit 133. Therefore, there is no need to form an entire surface of perovskite, including placing perovskite on portions other than the portion corresponding to the green color conversion unit 133, and then pattern perovskite to form the green color conversion unit 133. This prevents perovskite residue or a patterning process from affecting characteristics of other parts. For example, this prevents perovskite from remaining on a portion corresponding to the blue color resist 131, thereby preventing blue light from containing green light, and improving the color gamut and display performance of the display panel 100.

Sixth Embodiment

Figure 5:
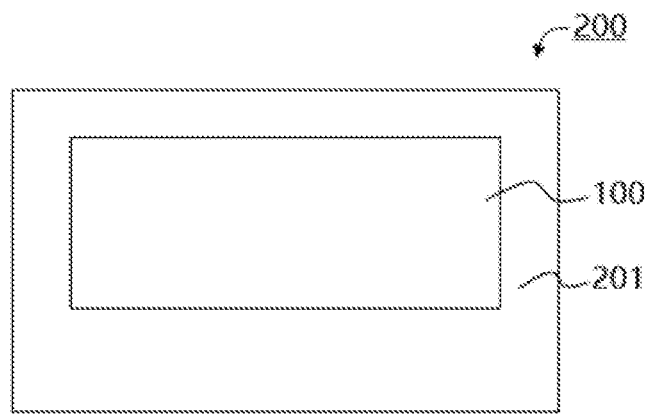
FIG. 5 is a schematic diagram of a display terminal according to an embodiment of the present disclosure.

Please refer to FIG. 5, which is a schematic diagram of a display terminal according to an embodiment of the present disclosure.

This embodiment provides a display terminal 200. The display terminal 200 comprises a terminal body 201 and any display panel 100 in the above embodiments. The terminal body 201 and the display panel 100 are combined into one body.

Specifically, the display terminal 200 may be a mobile phone, a notebook computer, a television, or the like.

The display panel, the method for manufacturing the same, and the display terminal provided by the embodiments of the present disclosure are described in detail above. The present disclosure uses specific examples to describe principles and embodiments of the present invention. The above description of the embodiments is only for helping to understand the present invention. Furthermore, those skilled in the art may make modifications to the specific embodiments and applications according to ideas of the present invention. In conclusion, the present specification should not be construed as a limitation to the present invention.

What is claimed is:

1. A display panel, comprising:
   an array substrate;
   a light-emitting device layer disposed on the array substrate and comprising a red light-emitting device, a first blue light-emitting device, and a second blue light-emitting device; and
   a color resist layer disposed on the light-emitting device layer and comprising a red color resist, a blue color resist, and a green color conversion unit; wherein the red color resist is disposed corresponding to the red light-emitting device, the blue color resist is disposed corresponding to the first blue light-emitting device, and the green color conversion unit is disposed corresponding to the second blue light-emitting device and is configured to convert a light emitted by the second blue light-emitting device into a green light;
   a second encapsulation layer disposed between the light-emitting device layer and the color resist layer; and
   a light extraction layer, disposed on a side of the light-emitting device layer away from the array substrate and between the light-emitting device layer and the second encapsulation layer.

2. The display panel according to claim 1, wherein the green color conversion unit is made of perovskite.

3. The display panel according to claim 1, wherein the color resist layer further comprises a spacer layer, the spacer layer comprises a plurality of openings, and the red color resist, the blue color resist, and the green color conversion unit are disposed in the openings of the spacer layer.

4. The display panel according to claim 3, wherein the spacer layer is a black matrix.

5. The display panel according to claim 1, further comprising:
   a first encapsulation layer disposed on a side of the color resist layer away from the light-emitting device layer.

6. The display panel according to claim 5, wherein the second encapsulation layer is disposed between the light-emitting device layer and the color resist layer.

7. The display panel according to claim 1, wherein the red light-emitting device is disposed between the first blue light-emitting device and the second blue light-emitting device.

8. A method for manufacturing a display panel, comprising:
   step S100: providing an array substrate;
   step S200: forming a light-emitting device layer on the array substrate, which comprises forming a red light-emitting device, a first blue light-emitting device, and a second blue light-emitting device; and
   step S300: forming a color resist layer on the light-emitting device layer, which comprises forming a red color resist, a blue color resist, and a green color conversion unit, wherein the red color resist is formed corresponding to the red light-emitting device, the blue color resist is formed corresponding to the first blue light-emitting device, and the green color conversion unit is formed corresponding to the second blue light-emitting device;

forming a second encapsulation layer, wherein the second encapsulation layer is disposed between the light-emitting device layer and the color resist layer; and forming a light extraction layer, wherein the light extraction layer is disposed on a side of the light-emitting device layer away from the array substrate and between the light-emitting device layer and the second encapsulation layer.

9. The method for manufacturing the display panel according to claim 8, wherein in the step S200, the green color conversion unit is made of perovskite.

10. The method for manufacturing the display panel according to claim 9, wherein in the step S300, the green color conversion unit is formed by vapor deposition of perovskite or inkjet printing perovskite.

11. A display terminal, comprising a terminal body and a display panel, wherein the terminal body and the display panel are combined into one body, and the display panel comprises:

an array substrate;

a light-emitting device layer disposed on the array substrate and comprising a red light-emitting device, a first blue light-emitting device, and a second blue light-emitting device; and a color resist layer disposed on the light-emitting device layer and comprising a red color resist, a blue color resist, and a green color conversion unit, wherein the red color resist is disposed corresponding to the red light-emitting device, the blue color resist is disposed corresponding to the first blue light-emitting device, and the green color conversion unit is disposed corresponding to the second blue light-emitting device and is configured to convert a light emitted by the second blue light-emitting device into a green light;

a second encapsulation layer disposed between the light-emitting device layer and the color resist layer; and a light extraction layer, disposed on a side of the light-emitting device layer away from the array substrate and between the light-emitting device layer and the second encapsulation layer.

12. The display terminal, according to claim 11, wherein the green color conversion unit is made of perovskite.

13. The display terminal, according to claim 11, wherein the color resist layer further comprises a spacer layer, the spacer layer comprises a plurality of openings, and the red color resist, the blue color resist, and the green color conversion unit are disposed in the openings of the spacer layer.

14. The display terminal, according to claim 13, wherein the spacer layer is a black matrix.

15. The display terminal, according to claim 11, further comprising:

a first encapsulation layer disposed on a side of the color resist layer away from the light-emitting device layer.

16. The display terminal, according to claim 15, wherein the second encapsulation layer is disposed between the light-emitting device layer and the color resist layer.

17. The display terminal, according to claim 11, wherein the red light-emitting device is disposed between the first blue light-emitting device and the second blue light-emitting device.

* * * * *